United States Patent
Ravezzi et al.

(10) Patent No.: US 7,453,315 B2
(45) Date of Patent: Nov. 18, 2008

(54) ACTIVE INDUCTIVE LOAD THAT ENHANCES CIRCUIT BANDWIDTH

(75) Inventors: Luca Ravezzi, Palo Alto, CA (US); Karthik Gopalakrishnan, San Jose, CA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/411,343

(22) Filed: Apr. 26, 2006

(65) Prior Publication Data

US 2007/0252642 A1  Nov. 1, 2007

(51) Int. Cl.
*H03H 11/24* (2006.01)
(52) U.S. Cl. .................. 327/581; 327/427; 327/434
(58) Field of Classification Search .......... 327/574, 327/581, 427, 434–437, 552; 333/214–217
See application file for complete search history.

(56) References Cited

U.S. PATENT DOCUMENTS

| | | | |
|---|---|---|---|
| 4,806,796 A | 2/1989 | Bushey et al. | |
| 5,087,898 A * | 2/1992 | Pyndiah et al. | 333/24 R |
| 5,256,991 A | 10/1993 | Campbell et al. | |
| 5,726,613 A | 3/1998 | Hayashi et al. | |
| 5,909,127 A | 6/1999 | Pearson et al. | |
| 6,211,753 B1 * | 4/2001 | Leifso et al. | 333/214 |
| 6,259,292 B1 * | 7/2001 | Congdon | 327/206 |
| 6,515,547 B2 * | 2/2003 | Sowlati | 330/311 |
| 6,515,560 B1 | 2/2003 | Adan | |
| 6,737,944 B2 | 5/2004 | Kunikiyo | |
| 6,825,722 B2 * | 11/2004 | Segawa | 330/254 |
| 6,927,631 B2 * | 8/2005 | Gupta et al. | 330/260 |
| 6,956,442 B2 | 10/2005 | Groen et al. | |
| 6,958,668 B1 | 10/2005 | Sackinger | |
| 7,135,932 B2 * | 11/2006 | Quadir et al. | 330/308 |
| 7,199,685 B2 * | 4/2007 | Gill | 333/214 |
| 7,202,706 B1 * | 4/2007 | Plasterer et al. | 326/127 |
| 7,288,971 B1 * | 10/2007 | Plasterer et al. | 326/127 |
| 2005/0007199 A1 * | 1/2005 | Quadir et al. | 330/277 |

* cited by examiner

*Primary Examiner*—N. Drew Richards
*Assistant Examiner*—Patrick O'Neill
(74) *Attorney, Agent, or Firm*—Dicke, Billig & Czaja, PLLC

(57) ABSTRACT

An active load including a current source, a first resistive element, and a switch. The current source is configured to provide a bias current and the first resistive element is configured to receive the bias current and provide a bias voltage. The switch has an input and an output and is configured to receive a drive voltage at the input, receive the bias voltage between the input and the output, provide an output voltage at the output that is sufficiently different than the drive voltage to maintain headroom, and provide an inductive impedance that enhances circuit bandwidth.

20 Claims, 3 Drawing Sheets

ACTIVE INDUCTIVE LOAD THAT ENHANCES CIRCUIT BANDWIDTH

BACKGROUND

Inductive loads can be used to enhance the bandwidth of circuits, such as amplifiers and buffers, which include the inductive loads. In these circuits, an inductive load exhibits an increase in impedance, referred to as inductive peaking, that is related to an increase in the operating frequency of the circuit that includes the inductive load. Inductive peaking in the inductive load extends the operating frequency range or bandwidth of the circuit that includes the inductive load.

An inductive load can be implemented in an integrated circuit as a passive spiral inductor or as an active inductive load. Often, a spiral inductor is large and, once designed, has a useful frequency range that cannot be changed very easily. In contrast, an active load with inductive peaking is small and has an operating frequency range that can be made programmable very efficiently.

Typically, an active inductive load requires a large voltage drop across the load with respect to the power supply voltage. This large voltage drop is subtracted from the power supply voltage to arrive at the headroom available for operation of the circuit that includes the inductive load. As power supply voltages drop, large voltage drops across active inductive loads become problematic, in that headroom decreases and the circuit that includes the active inductive load may cease to function reliably.

For these and other reasons there is a need for the present invention.

SUMMARY

One aspect of the present invention provides an active load including a current source, a first resistive element, and a switch. The current source is configured to provide a bias current and the first resistive element is configured to receive the bias current and provide a bias voltage. The switch has an input and an output and is configured to receive a drive voltage at the input, receive the bias voltage between the input and the output, provide an output voltage at the output that is sufficiently different than the drive voltage to maintain headroom, and provide an inductive impedance that enhances circuit bandwidth.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
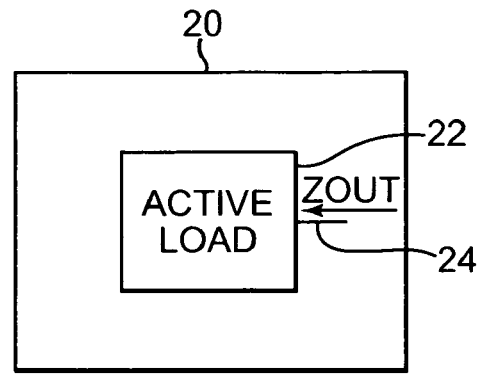
FIG. 1 is a diagram illustrating one embodiment of a circuit that includes an active load according to the present invention.

FIG. 1 is a diagram illustrating one embodiment of a circuit 20 that includes an active load 22 according to the present invention. Active load 22 provides impedance ZOUT at output 24. Impedance ZOUT at 24 is substantially constant across one operating frequency range and increases as the operating frequency increases above the constant impedance frequency range. Active load 22 can be used in low power supply voltage circuit designs. The voltage drop across active load 22 is configured to maintain headroom in circuit 20 and contribute to reliable operation of circuit 20.

In one embodiment, circuit 20 includes a differential pair of transistors and at least one of the transistors in the differential pair is electrically coupled to active load 22. In one embodiment, circuit 20 includes a differential pair of transistors and each of the transistors in the differential pair is electrically coupled to an active load that is similar to active load 22. In one embodiment, circuit 20 is an advanced memory buffer (AMB) circuit. In one embodiment, circuit 20 is a fully buffered dual in-line memory module (FB-DIMM). In other embodiments, circuit 20 can be any other suitable circuit, such as an amplifier, an input buffer, or an output buffer.

Active load 22 is an active inductive load that enhances or increases the operating circuit bandwidth of circuit 20. In one embodiment, active load 22 includes a switch that has its output connected to output 24 and its input connected to output 24 through a first resistive element. A bias current generates a bias voltage across the first resistive element, such that the voltage at output 24 is sufficiently different (e.g., sufficiently lower in the circuit configuration of FIG. 2) than the drive voltage at the input of the switch and an increase in the available operating headroom of circuit 20 is achieved. Impedance ZOUT at output 24 remains substantially constant for frequencies lower than a corner frequency and impedance ZOUT at output 24 increases, showing an inductive peaking behavior, for frequencies above the corner frequency.

Figure 2:
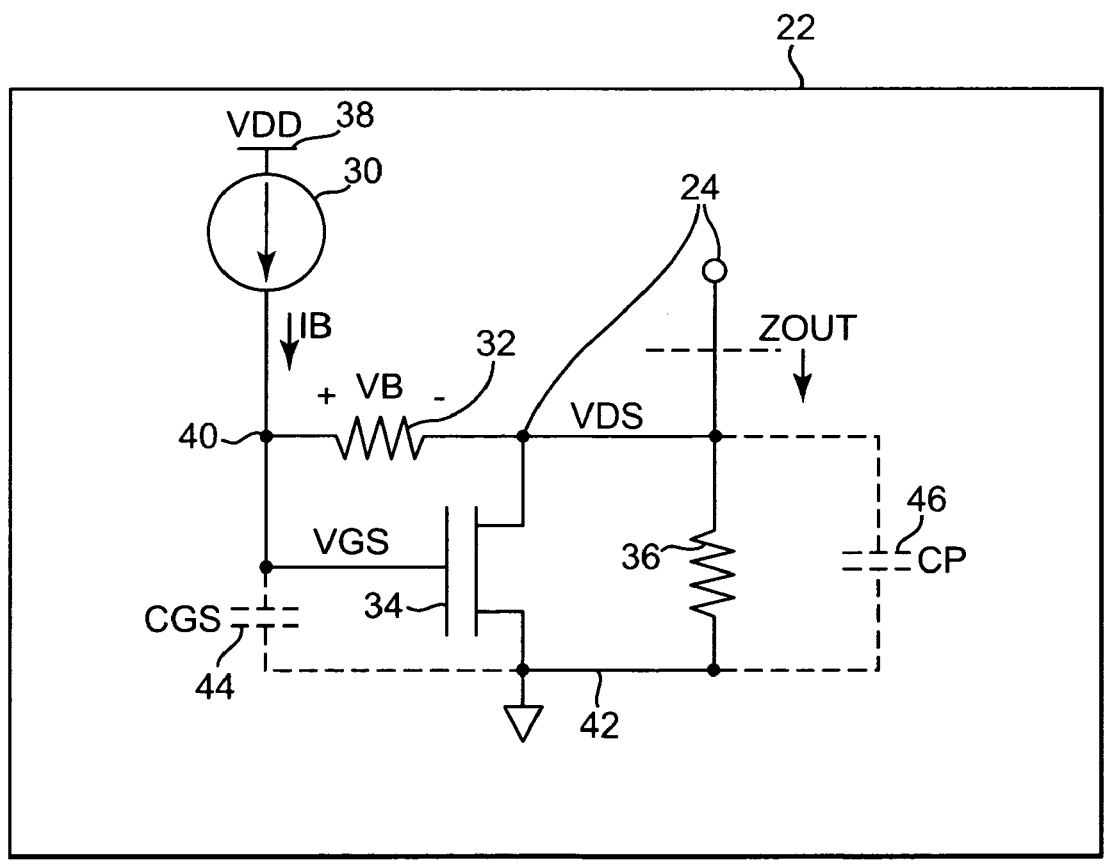
FIG. 2 is a diagram illustrating one embodiment of an active load.

FIG. 2 is a diagram illustrating one embodiment of active load 22. A circuit, such as circuit 20, is electrically coupled to output 24 to include active load 22 in the circuit. Active load 22 provides impedance ZOUT at 24 to the circuit.

Active load 22 includes a current source 30, a bias resistive element 32, a switch 34, and a load resistive element 36. Switch 34 is an n-channel metal oxide semiconductor (NMOS) transistor. Bias resistive element 32 is a resistor and load resistive element 36 is a resistor. In other embodiments, switch 34 can be any suitable type of switch, such as a p-channel metal oxide semiconductor (PMOS) transistor where a complementary active load configuration is used if switch 34 is a PMOS transistor. Also, in other embodiments, bias resistive element 32 and load resistive element 36 can be any suitable type of resistive elements.

One side of current source 30 is electrically coupled to a supply node, such as power VDD at 38. The other side of current source 30 is electrically coupled at 40 to one side of bias resistive element 32 and the gate of switch 34. The other side of bias resistive element 32 is electrically coupled at 24 to the drain of switch 34 and one side of load resistive element 36. The source of switch 34 is electrically coupled to the other side of load resistive element 36 and to a reference, such as ground, at 42.

Switch 34 includes an internal gate-to-source capacitance CGS at 44 and a parasitic capacitance CP at 46. One side of capacitance CGS at 44 is electrically coupled at 40 to the gate of switch 34 and the other side of capacitance CGS at 44 is electrically coupled at 42 to the source of switch 34. One side of capacitance CP at 46 is electrically coupled at 24 to the drain of switch 34 and the other side of capacitance CP at 46 is electrically coupled at 42 to the source of switch 34. In other embodiments, an external capacitor can be electrically coupled in parallel with gate-to-source capacitance CGS.

In operation, current source 30 provides a constant bias current IB at 40 that is received by bias resistive element 32. Bias current IB at 40 flows through bias resistive element 32, which provides a bias voltage VB across bias resistive element 32. At low frequencies, the bias voltage VB is a constant voltage drop across bias resistive element 32, from the gate to the drain of switch 34.

To turn on switch 34, the gate-to-source voltage VGS at 40, which is the drive voltage for switch 34, is equal to a threshold voltage plus a gate overhead drive voltage. The drain-to-source voltage VDS at 24, which is the active load output voltage, is equal to the gate-to-source voltage VGS at 40 minus the bias voltage VB. As a result, the drain-to-source voltage VDS at 24 is less than the gate-to-source voltage VGS at 40. The headroom of circuit 20 is the difference of the supply voltage VDD minus the active load output voltage VDS at 24. In one embodiment, the bias voltage VB is configured to be substantially equal to the threshold voltage, such that the drain-to-source voltage VDS at 24 is substantially equal to the gate overhead drive voltage at 40 and transistor switch 34 operates in the saturation region.

Reducing the drain-to-source voltage VDS, increases the headroom in the circuit that includes active load 22, such as circuit 20, and contributes to reliable operation of the circuit. Also, active load 22 can be used in lower power supply voltage circuit designs.

Active load 22 is an active inductive load that enhances or increases the operating circuit bandwidth of the circuit that includes active load 22, such as circuit 20. Active load 22 provides inductive impedance ZOUT at 24 that is substantially constant across one operating frequency range. Impedance ZOUT at 24 increases to provide higher impedances or inductive peaking as the operating frequency increases beyond a zero frequency Z0, i.e., the corner frequency, of active load 22. The zero frequency Z0 is equal to the cut-off frequency FCO of the low-pass filter formed by the first resistive element 32 and capacitance CGS at 44.

Switch 34 includes a transconductance gm. At low frequencies, if bias resistive element 32 and load resistive element 36 are higher than the impedance 1/gm, impedance ZOUT at 24 is substantially equal to the impedance 1/gm. As the operating frequency increases up to the cut-off frequency FCO, impedance ZOUT remains substantially equal to 1/gm.

The cut-off frequency FCO in Equation I is based on the gate-to-source capacitance CGS at 44 and bias resistive element 32, which is R1 in Equation I.

$$FCO = 1/(CGS*R1) \qquad \text{Equation I}$$

As the operating frequency increases beyond the cut-off frequency FCO, the overall effect of transconductance gm weakens to increase impedance ZOUT at 24. At higher frequencies, the gate-to-source capacitance CGS at 44 is substantially shorted to short the gate of switch 34 to the reference at 42, and impedance ZOUT at 24 reaches the maximum impedance value of Equation II.

$$ZOUT|_{MAX} = R1\|R2\|rds \qquad \text{Equation II}$$

Where, R2 is the resistance of load resistive element 36 and rds is the small signal drain resistance of switch 34. The maximum impedance ZOUT is substantially equal to the parallel combination of bias resistive element 32, load resistive element 36, and the small signal drain resistance rds of switch 34. As the frequency increases further, parasitic capacitance CP at 46 dominates and impedance ZOUT at 24 rolls off to a low impedance value.

Equation III is the expression for impedance ZOUT at 24 from a small signal analysis of active load 22.

$$ZOUT = \frac{ROUT*(1+(S*CGS*R1))}{(S^2*CGS*CP*R1*ROUT)+(S*(CP*ROUT+CGS*(R1+ROUT)))+(gm*ROUT)+1} \qquad \text{Equation III}$$

where:

$$ROUT = rds\|R_2$$

The expression for impedance ZOUT at 24 in Equation III shows a zero frequency Z0 of Equation IV that is equal to the cut-off frequency FCO in Equation I.

$$Z0 = 1/(CGS*R1) \qquad \text{Equation IV}$$

Figure 3:
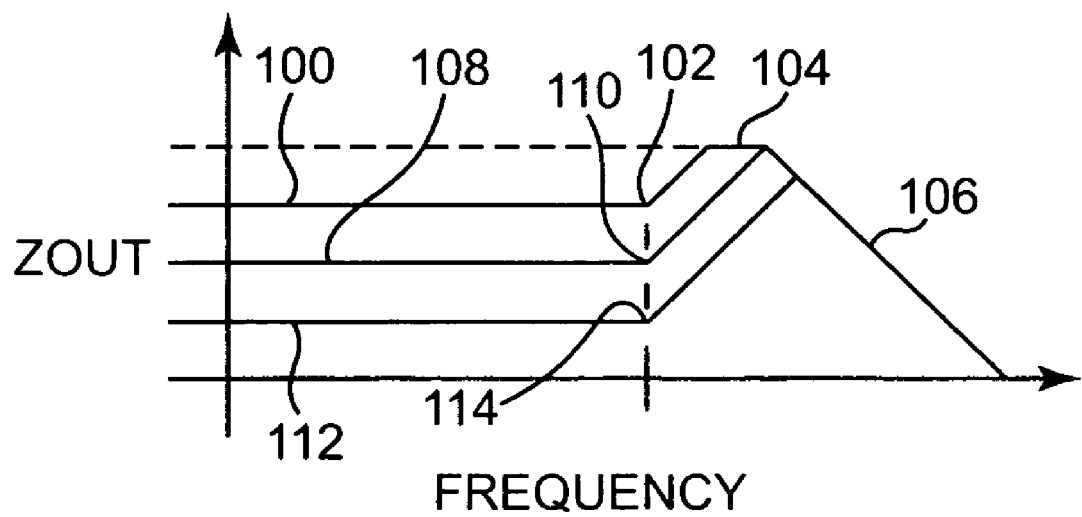
FIG. 3 is a bode diagram illustrating impedance versus operating frequency and including different values for a constant bias current.

FIG. 3 is a bode diagram illustrating impedance ZOUT at 24 versus the operating frequency and including different values for constant bias current IB at 40. If bias current IB at 40 is increased, the voltage drop across bias resistive element 32 increases and the drain current through switch 34 increases, which results in an increase in the transconductance gm. At low frequencies, if bias resistive element 32 and load resistive element 36 are higher than the impedance 1/gm, impedance ZOUT at 24 is substantially equal to the impedance 1/gm. Thus, an increase in the transconductance gm results in a decrease in impedance ZOUT at 24.

At 100, a small bias current IB at 40 results in a large impedance ZOUT at 24 at low operating frequencies. As the operating frequency increases up to the zero frequency Z0 of Equation IV, impedance ZOUT at 24 remains substantially equal to 1/gm. At 102, the operating frequency is at the zero frequency Z0 and as the operating frequency increases beyond the zero frequency Z0, the overall effect of transconductance gm weakens to increase impedance ZOUT at 24. At higher frequencies, the gate-to-source capacitance CGS at 44 is substantially shorted to short the gate of switch 34 to the reference at 42 and, at 104, impedance ZOUT at 24 reaches the maximum impedance value of Equation II. As frequency increases further, parasitic capacitance CP at 46 dominates and impedance ZOUT at 24 rolls off at 106 to a low impedance value.

At 108, a medium sized bias current IB at 40 results in a medium impedance ZOUT at 24 at low operating frequencies. As the operating frequency increases up to the zero frequency Z0 of Equation IV, impedance ZOUT at 24 remains substantially equal to 1/gm. At 110, the operating frequency is at the zero frequency Z0, which is the same as the zero frequency Z0 at 102. As the operating frequency increases beyond the zero frequency Z0 at 110, the overall effect of transconductance gm weakens to increase impedance ZOUT at 24. Impedance ZOUT at 24 reaches the maximum impedance value of Equation II at 104 and as the frequency increases further, parasitic capacitance CP at 46 dominates and impedance ZOUT at 24 rolls off at 106 to a low impedance value.

At 112, a large bias current IB at 40 results in a small impedance ZOUT at 24 at low operating frequencies. As the operating frequency increases up to the zero frequency Z0 of Equation IV, impedance ZOUT at 24 remains substantially equal to 1/gm. At 114, the operating frequency is at the zero frequency Z0, which is the same as the zero frequency Z0 at 102 and at 110. As the operating frequency increases beyond the zero frequency Z0 at 114, the overall effect of transconductance gm weakens and impedance ZOUT at 24 increases toward the maximum impedance value of Equation II. As the frequency increases further, parasitic capacitance CP at 46 dominates and impedance ZOUT at 24 rolls off at 106 to a low impedance value.

Figure 4:
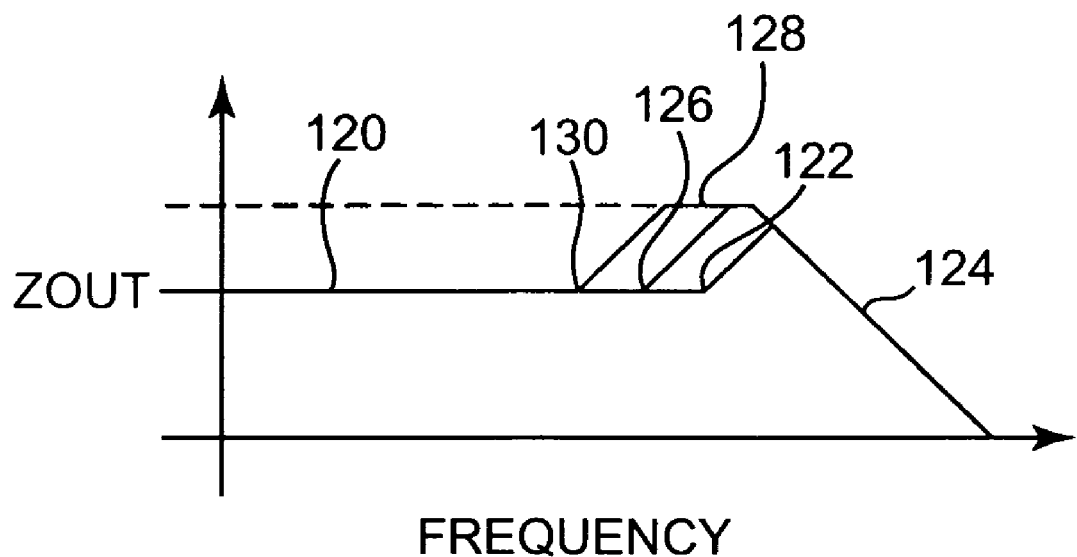
FIG. 4 is a bode diagram illustrating impedance versus operating frequency and including different resistant values for a bias resistive element.

FIG. 4 is a bode diagram illustrating impedance ZOUT at 24 versus the operating frequency and including different resistance values for bias resistive element 32. If bias resistive element 32 is increased, the cut-off frequency FCO in Equation I and the zero frequency Z0 in Equation IV are decreased.

At 120, if bias resistive element 32 and load resistive element 36 are higher than the impedance 1/gm, impedance ZOUT at 24 is substantially equal to the impedance 1/gm at low frequencies. As the operating frequency increases up to the zero frequency Z0 of Equation IV, impedance ZOUT at 24 remains substantially equal to 1/gm.

If bias resistive element 32 is small, the zero frequency Z0 is a large frequency value at 122. As the operating frequency increases beyond the zero frequency Z0 at 122, the overall effect of transconductance gm weakens to increase impedance ZOUT at 24 toward the maximum impedance value of Equation II. As the frequency increases further, parasitic capacitance CP at 46 dominates and impedance ZOUT at 24 rolls off at 124 to a low impedance value.

If bias resistive element 32 is a medium resistance value, the zero frequency Z0 is at a medium or middle frequency at 126. As the operating frequency increases beyond the zero frequency Z0 at 126, the overall effect of transconductance gm weakens to increase impedance ZOUT at 24. At higher frequencies, the gate-to-source capacitance CGS at 44 is substantially shorted to short the gate of switch 34 to the reference at 42 and impedance ZOUT at 24 reaches the maximum impedance value of Equation II at 128. As the frequency increases further, parasitic capacitance CP at 46 dominates and impedance ZOUT at 24 rolls off at 124 to a low impedance value.

If bias resistive element 32 is a large resistance value, the zero frequency Z0 is at a small or low frequency at 130. As the operating frequency increases beyond the zero frequency Z0 at 130, the overall effect of transconductance gm weakens to increase impedance ZOUT at 24. At higher frequencies, the gate-to-source capacitance CGS at 44 is substantially shorted to short the gate of switch 34 to the reference at 42 and impedance ZOUT at 24 reaches the maximum impedance value of Equation II at 128. As the frequency increases further, parasitic capacitance CP at 46 dominates and impedance ZOUT at 24 rolls off at 124 to a low impedance value.

Figure 5:
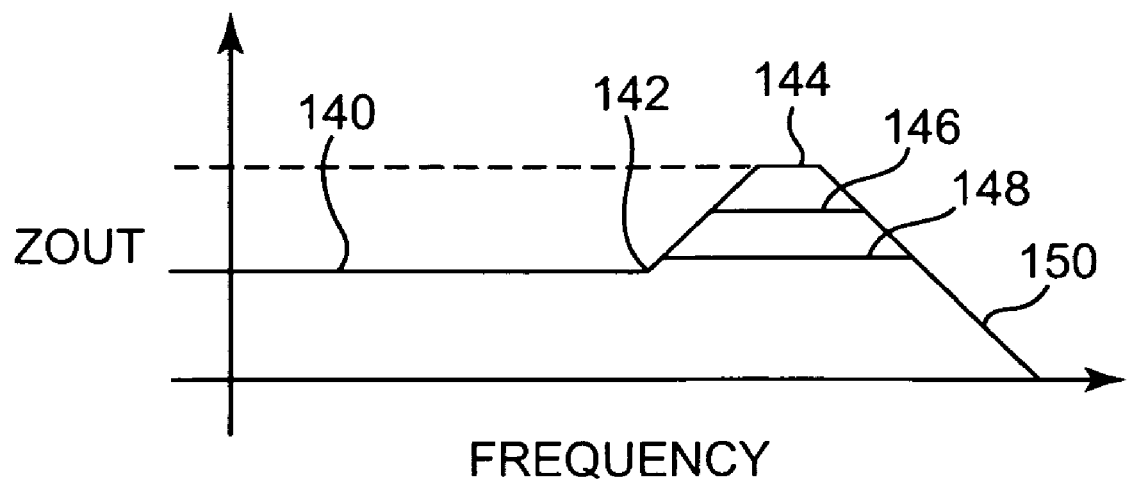
FIG. 5 is a bode diagram illustrating impedance versus operating frequency and including different resistant values for a load resistive element.

FIG. 5 is a bode diagram illustrating impedance ZOUT at 24 versus the operating frequency and including different resistance values for load resistive element 36. If load resistive element 36 is increased, the maximum impedance ZOUT in Equation II is increased.

At 140, if bias resistive element 32 and load resistive element 36 are higher than the impedance 1/gm, impedance ZOUT at 24 is substantially equal to the impedance 1/gm at low frequencies. As the operating frequency increases up to the zero frequency Z0 of Equation IV at 142, impedance ZOUT at 24 remains substantially equal to 1/gm.

As the operating frequency increases beyond the zero frequency Z0 at 142, the overall effect of transconductance gm weakens to increase impedance ZOUT at 24 toward the maximum impedance value of Equation II. If load resistive element 36 is a large resistance value, impedance ZOUT at 24 increases to the maximum impedance value at 144. If load resistive element 36 is a medium resistance value, impedance ZOUT at 24 increases to the maximum impedance value at 146. If load resistive element 36 is a small resistance value, impedance ZOUT at 24 increases to the maximum impedance value at 148. As the frequency increases further, parasitic capacitance CP at 46 dominates and impedance ZOUT at 24 rolls off at 150 to a low impedance value.

Figure 6:
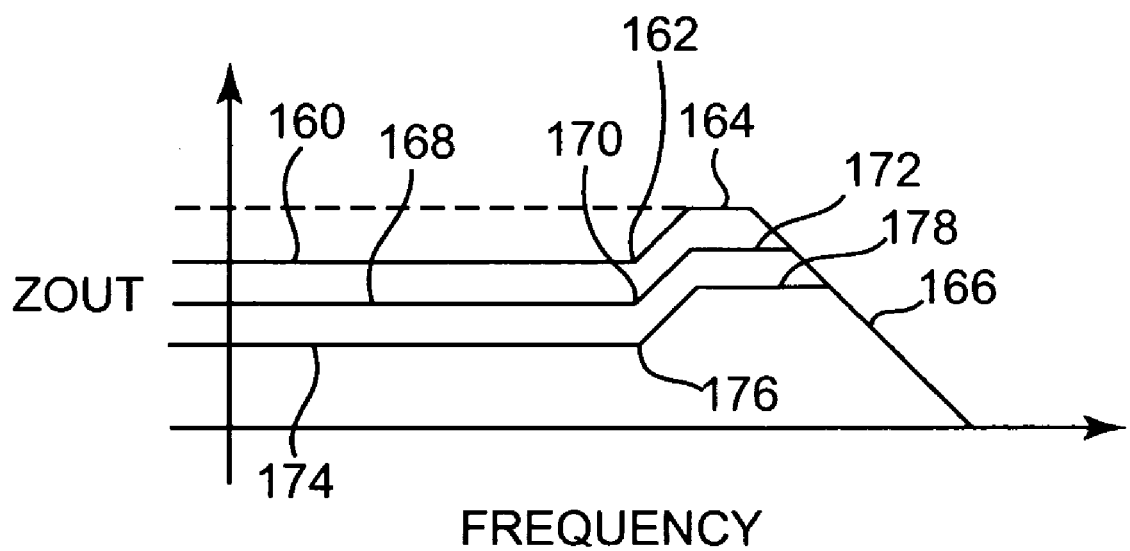
FIG. 6 is a bode diagram illustrating impedance versus operating frequency and including different sized switches.

FIG. 6 is a bode diagram illustrating impedance ZOUT at 24 versus the operating frequency and including different sized switches 34. If the size of switch 34 is increased, the transconductance gm is increased and the small signal drain-to-source resistance rds is decreased. At low frequencies, if bias resistive element 32 and load resistive element 36 are higher than the impedance 1/gm, impedance ZOUT at 24 is substantially equal to the impedance 1/gm. Thus, an increase in the transconductance gm results in a decrease in impedance ZOUT at 24 at low frequencies. Also, the decrease in the small signal drain-to-source resistance rds results in a decrease in the maximum impedance ZOUT at 24 in Equation II.

At 160, a small switch 34 results in large impedance ZOUT at 24 at low operating frequencies. As the operating frequency increases up to the zero frequency Z0 of Equation IV, impedance ZOUT at 24 remains substantially equal to 1/gm. At 162, the operating frequency is at the zero frequency Z0 and as the operating frequency increases beyond the zero frequency Z0, the overall effect of transconductance gm weakens to increase impedance ZOUT at 24. At higher frequencies, the gate-to-source capacitance CGS at 44 is substantially shorted to short the gate of switch 34 to the reference at 42 and, at 164, impedance ZOUT at 24 reaches the maximum impedance value of Equation II. As the frequency increases further, parasitic capacitance CP at 46 dominates and impedance ZOUT at 24 rolls off at 166 to a low impedance value.

At 168, a medium size switch 34 results in medium impedance ZOUT at 24 at low operating frequencies. As the operating frequency increases up to the zero frequency Z0 of Equation IV, impedance ZOUT at 24 remains substantially equal to 1/gm. At 170, the operating frequency is at the zero frequency Z0 and as the operating frequency increases beyond the zero frequency Z0 at 170, the overall effect of transconductance gm weakens to increase impedance ZOUT at 24. Impedance ZOUT at 24 reaches the maximum impedance value of Equation II at 172. As the frequency increases further, parasitic capacitance CP at 46 dominates and impedance ZOUT at 24 rolls off at 166 to a low impedance value.

At 174, a large size switch 34 results in a small impedance ZOUT at 24 at low operating frequencies. As the operating frequency increases up to the zero frequency Z0 of Equation IV, impedance ZOUT at 24 remains substantially equal to 1/gm. At 176, the operating frequency is at the zero frequency Z0 and as the operating frequency increases beyond the zero frequency Z0 at 176, the overall effect of transconductance gm weakens and impedance ZOUT at 24 increases to the maximum impedance value of Equation II at 178. As the frequency increases further, parasitic capacitance CP at 46 dominates and impedance ZOUT at 24 rolls off at 166 to a low impedance value.

Impedance ZOUT at 24 is substantially constant across one operating frequency range and increases as the operating frequency increases above the constant impedance frequency range. The voltage drop across active load 22 is configured to maintain large headroom in circuit 20 and contribute to reliable operation of circuit 20. Also, active load 22 can be used in low power supply voltage circuit designs.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An active load, comprising:
    a current source configured to provide a constant bias current;
    a first resistive element configured to receive the constant current and provide a bias voltage;
    an n-channel metal oxide semiconductor (NMOS) transistor having a gate and a drain, the NMOS transistor configured to receive a drive voltage at the gate, receive the bias voltage between the gate and the drain, provide an output voltage at the drain that is sufficiently different than the drive voltage to maintain headroom, and provide an inductive impedance that enhances circuit bandwidth; and
    a second resistive element configured to provide a constant load resistance between the drain and source of the NMOS transistor.

2. The active load of claim 1, wherein the NMOS transistor includes an internal capacitance and the inductive impedance includes a zero frequency that is based on the internal capacitance and the first resistive element.

3. The active load of claim 2, wherein the inductive impedance begins increasing at the zero frequency to provide inductive peaking impedance values substantially between the inverse of one of the trans-conductance and the trans-impedance of the NMOS transistor, and a parallel impedance combination including the first resistive element and an internal resistance of the NMOS transistor.

4. The active load of claim 1, wherein the bias voltage is substantially equal to the threshold voltage of the NMOS transistor.

5. An active load, comprising:
    a current source configured to provide a constant bias current;
    a first resistive element configured to receive the constant current and provide a bias voltage;
    an n-channel metal oxide semiconductor (NMOS) transistor comprising an input and an output, wherein the bias voltage is provided between the input and the output to bias the NMOS transistor, wherein an impedance at the output increases to provide inductive peaking at frequencies higher than a zero frequency that is based on the first resistive element and an internal capacitance of the NMOS transistor; and
    a second resistive element coupled to the output of the NMOS transistor and configured to provide a constant load resistance between the drain and source of the NMOS transistor, wherein the impedance at the output rises to a maximum impedance of a parallel combination of the first resistive element, the second resistive element, and an internal resistance of the NMOS transistor.

6. The active load of claim 5, wherein the impedance at the output increases at frequencies higher than the zero frequency to a value substantially between the inverse of the trans-conductance of the NMOS transistor and the maximum impedance.

7. The active load of claim 5, wherein the bias voltage is substantially equal to the threshold voltage of the NMOS transistor.

8. The active load of claim 5, wherein the NMOS transistor is configured to receive a drive voltage at the input and provide an output voltage at the output that is lower than the drive voltage.

9. An active load, comprising:
    means for sourcing a constant bias current;
    means for providing a bias voltage based on the constant bias current;
    means for biasing an n-channel metal oxide semiconductor (NMOS) transistor via the bias voltage to maintain headroom;
    means for providing an inductive impedance that enhances circuit bandwidth; and
    means for providing a constant load resistance between drain and source of the NMOS transistor.

10. The active load of claim 9, wherein the means for providing an inductive impedance comprises:
    means for providing an inductive impedance that includes a zero frequency based on an internal capacitance of the NMOS transistor and a resistive element.

11. The active load of claim 10, wherein the means for providing an inductive impedance comprises:
    means for providing an inductive impedance that increases at frequencies higher than the zero frequency to provide inductive peaking impedance values substantially between the inverse of the trans-conductance of the NMOS transistor and a parallel impedance combination including the resistive element and an internal resistance of the NMOS transistor.

12. The active load of claim 9, wherein the means for providing a bias voltage based on the constant bias current comprises:
    means for providing a bias voltage that is substantially equal to the threshold voltage of the NMOS transistor.

13. A method for providing an active load, comprising:
    sourcing a constant bias current;
    providing a bias voltage across a resistive element via the constant bias current;
    biasing an n-channel metal oxide semiconductor (NMOS) transistor via the bias voltage to maintain headroom;
    providing an inductive impedance to enhance circuit bandwidth; and providing a constant load resistance between drain and source of the NMOS transistor.

14. The method of claim 13, wherein providing an inductive impedance comprises:
providing an inductive impedance that includes a zero frequency based on an internal capacitance of the NMOS transistor and the resistive element.

15. The method of claim 14, wherein providing an inductive impedance comprises:
providing an inductive impedance that increases at frequencies higher than the zero frequency to provide inductive peaking impedance values substantially between the inverse of the trans-conductance of the NMOS transistor and a parallel impedance combination including the resistive element and an internal resistance of the NMOS transistor.

16. The method of claim 13, wherein providing a bias voltage comprises:
providing a bias voltage that is substantially equal to the threshold voltage of the NMOS transistor.

17. A method for providing an active load, comprising:
sourcing a constant bias current;
receiving the constant bias current at a first resistive element to provide a bias voltage across the first resistive element based on the constant bias current;
biasing an n-channel metal oxide semiconductor (NMOS) transistor via the bias voltage;
outputting at an output of the NMOS transistor an impedance that increases to provide inductive peaking beyond a zero frequency that is based on the first resistive element and an internal capacitance of the NMOS transistor; and
outputting at the output of the NMOS transistor the impedance that rises to a maximum impedance of a parallel combination of the first resistive element, a second resistive element that is coupled to the output and configured to provide a constant load resistance between the drain and source of the NMOS transistor, and an internal resistance of the NMOS transistor.

18. The method of claim 17, comprising:
outputting at the output of the NMOS transistor the impedance that increases at frequencies higher than the zero frequency to values substantially between the inverse of the trans-conductance of the NMOS transistor and the maximum impedance.

19. The method of claim 17, wherein biasing an NMOS transistor comprises:
biasing via the bias voltage which is substantially equal to a threshold voltage of the NMOS transistor.

20. The method of claim 17, comprising:
receiving a drive voltage at an input of the NMOS transistor; and
outputting an output voltage at the output that is lower than the drive voltage.

* * * * *